United States Patent
Boynapalli et al.

(10) Patent No.: US 9,666,301 B2
(45) Date of Patent: May 30, 2017

(54) SCANNABLE MEMORIES WITH ROBUST CLOCKING METHODOLOGY TO PREVENT INADVERTENT READS OR WRITES

(71) Applicant: QUALCOMM Incorporated, San Diego, CA (US)

(72) Inventors: Venugopal Boynapalli, San Marcos, CA (US); Kashyap Ramachandra Bellur, Bangalore KRN (IN); Prabaharan Balu, Banagalore KRN (IN); Bilal Zafar, San Diego, CA (US); Alex Dongkyu Park, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 14/488,171

(22) Filed: Sep. 16, 2014

(65) Prior Publication Data
US 2016/0078965 A1    Mar. 17, 2016

(51) Int. Cl.
*G01R 31/28* (2006.01)
*G11C 29/08* (2006.01)
(Continued)

(52) U.S. Cl.
CPC .............. *G11C 29/08* (2013.01); *G11C 29/32* (2013.01); *G11C 8/16* (2013.01); *G11C 29/20* (2013.01); *G11C 2029/3202* (2013.01)

(58) Field of Classification Search
CPC .. G11C 29/32; G11C 29/08; G01R 31/318536
See application file for complete search history.

(56) References Cited

U.S. PATENT DOCUMENTS 5,675,545 A * 10/1997 Madhavan ............. G11C 29/54
                                                        365/201
8,028,209 B2    9/2011 Li et al.
(Continued)

FOREIGN PATENT DOCUMENTS

WO    2014013298 A1    1/2014

OTHER PUBLICATIONS

Partial International Search Report—PCT/US2015/041194—ISA/EPO—Nov. 12, 2015.
(Continued)

*Primary Examiner* — Thien D Nguyen
(74) *Attorney, Agent, or Firm* — Procopio, Cory, Hargreaves & Savitch LLP

(57) ABSTRACT

An example scannable register file includes a plurality of memory cells and, a shift phase of a scan test shifts data bits from a scan input through the plurality of memory cells to a scan output. The shifting can be performed by, on each clock cycle, reading one of the plurality of memory cells to supply the scan out and writing one of the plurality of memory cells with the data bit on a scan input. To perform sequential reads and writes on each clock cycle, the scannable register can generate a write clock that, during the shift phase, is inverted from the clock used for functional operation. The write clock is generated without glitches so that unintended writes do not occur. Scannable register files can be integrated with scan-based testing (e.g., using automatic test pattern generation) of other modules in an integrated circuit.

28 Claims, 5 Drawing Sheets

(51) Int. Cl.
*G11C 29/32* (2006.01)
*G11C 8/16* (2006.01)
*G11C 29/20* (2006.01)

(56) References Cited

U.S. PATENT DOCUMENTS

| | | |
|---|---|---|
| 8,065,572 B2 | 11/2011 | Ziaja et al. |
| 8,327,205 B2 | 12/2012 | Waayers et al. |
| 8,522,090 B1 | 8/2013 | Swarnkar et al. |
| 8,650,524 B1 | 2/2014 | Chakravadhanula et al. |
| 2005/0268185 A1 | 12/2005 | Vinke et al. |
| 2006/0123295 A1* | 6/2006 | Tanaka ............. G01R 31/31853 714/726 |
| 2008/0155362 A1* | 6/2008 | Chang ..................... G11C 8/16 714/718 |
| 2010/0332929 A1* | 12/2010 | Branch ............ G01R 31/31853 714/731 |
| 2012/0072793 A1* | 3/2012 | Rao .................. G01R 31/31854 714/719 |
| 2015/0206559 A1* | 7/2015 | Priel ........................ G11C 7/22 711/105 |

OTHER PUBLICATIONS

Sas J.V., et al., "Testability Strategy and Test Pattern Generation for Register Files and Customized Memories", Microprocessors and Microsystems, IPC Business Press Ltd. Londong, GB, XP000150616, Sep. 1, 1990, vol. 14, No.7, pp. 444-456, ISSN: 0141-9331, DOI:10.1016/0141-9331(90)90023-O.

International Search Report and Written Opinion—PCT/US2015/041194—ISA/EPO—Mar. 3, 2016.

\* cited by examiner

SCANNABLE MEMORIES WITH ROBUST CLOCKING METHODOLOGY TO PREVENT INADVERTENT READS OR WRITES

BACKGROUND

Field

The present invention relates to integrated circuits and, more particularly, to memories that are scannable for testing.

Background

System-on-a-chip (SoC) integrated circuits (ICs) have grown increasing complex. An SoC may include a large number (e.g., 100 s) of small (e.g., 64 words by 64 bits) memories. This document uses the terms "memory" and "register file" broadly to include various forms of storage such as random access memories and multi-ported memories. The memories on an SoC are tested after fabrication to verify that they function correctly. Thorough and efficient production testing of SoC circuits has increased in complexity and importance. Prior approaches to testing these memories include built-in self-test (BIST) and ad hoc methods. Limitations of prior approaches include expense, for example, due to engineering development time, production test time, or die area used for BIST circuits.

SUMMARY

In one aspect, a scannable register file is provided that includes: a register file module configured to produce a read data output by reading data from a memory location selected based on a register file read address input, wherein the reading is triggered by rising edges of a register file read clock input, and write data from a register file write data input to a memory location selected based on a register file write address input, wherein the writing is triggered by edges of a register file write clock input; and a scan logic module configured to receive a scan clock input, a scan enable input, and shift enable input and to supply the register file read address input, the register file write address input, the register file read clock, and the register file write clock to the register file module.

In one aspect, a scannable register file is provided that includes a plurality of memory cells, the scannable register file configured to, during a shift phase of a scan test, shift data bits from a scan input through the plurality of memory cells to a scan output, wherein on each cycle of a scan clock: the scannable register file reads one of the plurality of memory cells to supply the scan out and writes one of the plurality of memory cells with one of the data bits on the scan input.

In one aspect, method is provided for use in scan testing of a register file. The method includes: shifting, during a shift phase of a scan test, data bits from a scan input through the plurality of memory cells to a scan output; reading, when not in the shift phase, a location of the plurality of memory cells identified by an external read address input to produce a read data output; and writing, when not in the shift phase, from an external write data input to a location of the plurality of memory cells identified by an external write address input.

In one aspect, an apparatus is provided that includes: a means for storing data in a plurality of memory cells, and a means for controlling the means for storing data in a plurality of memory cells to perform a scan test.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
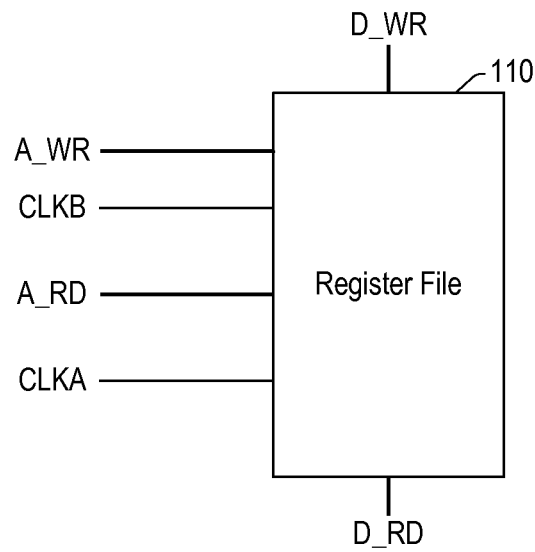
FIG. 1 is a functional block diagram of a register file.

FIG. 1 is a functional block diagram of a register file 110. The register file may be implemented, for example, in a complementary metal oxide semiconductor (CMOS) system-on-a-chip (SoC) integrated circuit (IC). The register file 110 includes a read port and a write port.

The write port includes a write address input A_WR and a write data input D_WR. The write address input A_WR identifies a location in the register file 110 to which data on the write data input D_WR will be written. An implementation of the register file 110 may condition writes based on write enable and chip select inputs.

The read port includes a read address input A_RD and a read data output D_RD. The read address input A_RD identifies a location in the register file 110 from which data will be read and supplied on the read data signal D_RD. An implementation of the register file 110 may condition reads based on read enable input and chip select inputs.

Timing of reads is based on a read clock input CLKA. For example, the register file 110 may initiate reads on rising edges of the read clock input CLKA. Timing of writes is based on a write clock input CLKB. For example, the register file 110 may initiate writes on rising edges of the write clock input CLKB. The write clock input CLKB and the read clock input CLKA may be coupled to the same clock signal.

Figure 2:
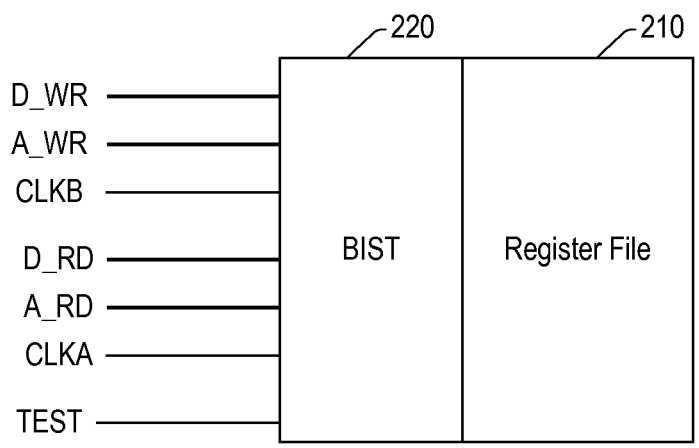
FIG. 2 is a functional block diagram of a register file with built-in self-test.

FIG. 2 is a functional block diagram of a register file with built-in self-test (BIST). The register file may be implemented, for example, in a CMOS SoC.

The register file includes a register file module 210 that includes memory circuits for functional operation of the register file. The register file module 210 may be implemented, for example, using the register file 110 of FIG. 1.

The register file includes a BIST module 220 that supplies signals to the register file module 210 during production testing of the register file. Test functions of the BIST module 220 are enabled by a test input TEST. During test, the BIST module 220 overrides the read port and the write port and may, for example, write internally-generated data patterns to locations in the register file module 210, read data from the register file module 210, and analyze the read data to determine whether the register file functions correctly. During functional operation, the BIST module 220 couples the read port and the write port to the register file module 210.

The complexity of the BIST module 220 is approximately proportional to the log of the size of the register file module 210. Thus, the percentage of the register file that is for BIST is larger for smaller memories. In a SoC with many small memories, the BIST functions can be occupy significant die area.

Figure 3:
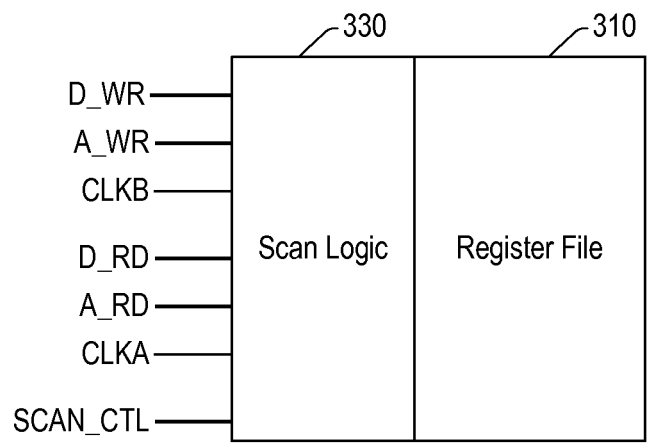
FIG. 3 is a functional block diagram of a scannable register file according to a presently disclosed embodiment.

FIG. 3 is a functional block diagram of a scannable register file according to a presently disclosed embodiment. The scannable register file may be implemented, for example, in a CMOS SoC.

The scannable register file includes a register file module 310 that includes memory circuits for functional operation of the scannable register file. The register file module 310 may be implemented, for example, using the register file 110 of FIG. 1.

The scannable register file includes a scan logic module 330 that can cause the scannable register file to operate as scan flip-flops during production testing of the scannable register file. Test functions of the scan logic module 330 are selected by a scan-control input SCAN_CTL. During test, the scan logic module 330 overrides the read port and the write port and supplies signals to the register file module 310.

During shift phases of scan testing, data are shifted through the individual memory cells of the register file module 310. The scan logic module 330 can cause data to shift through the register file module 310 by, for example, supplying sequential addresses (modulo the number of memory locations) to select locations in the register file, reading from the selected location to produce a scan output, and writing from a scan input to the selected location. The read and write ports of the scannable register file may be referred to as external ports, and the read and write ports of the register file module 310 may be referred to as internal ports.

During capture phases of scan testing, data are read from and written to the memory cells of the register file module 310 as during functional operation. The scan logic module 330 can, during capture phases of scan testing, couple the read port and the write port of the scannable register file to the read port and the write port of the register file module 310. Similarly, during functional operation, the scan logic module 330 couples the read port and the write port of the scannable register file to the read port and the write port of the register file module 310.

The complexity of the scan logic module 330 can be much less than the complexity of the BIST module 220 of the register file of FIG. 2. This can save die area and cost. Additionally, testing of the scannable register file can be integrated with scan-based testing of other modules in the SoC. For example, automatic test pattern generation (ATPG) can be applied to the scannable register file. This can reduce the cost of developing manufacturing tests for the SoC.

Figure 6:
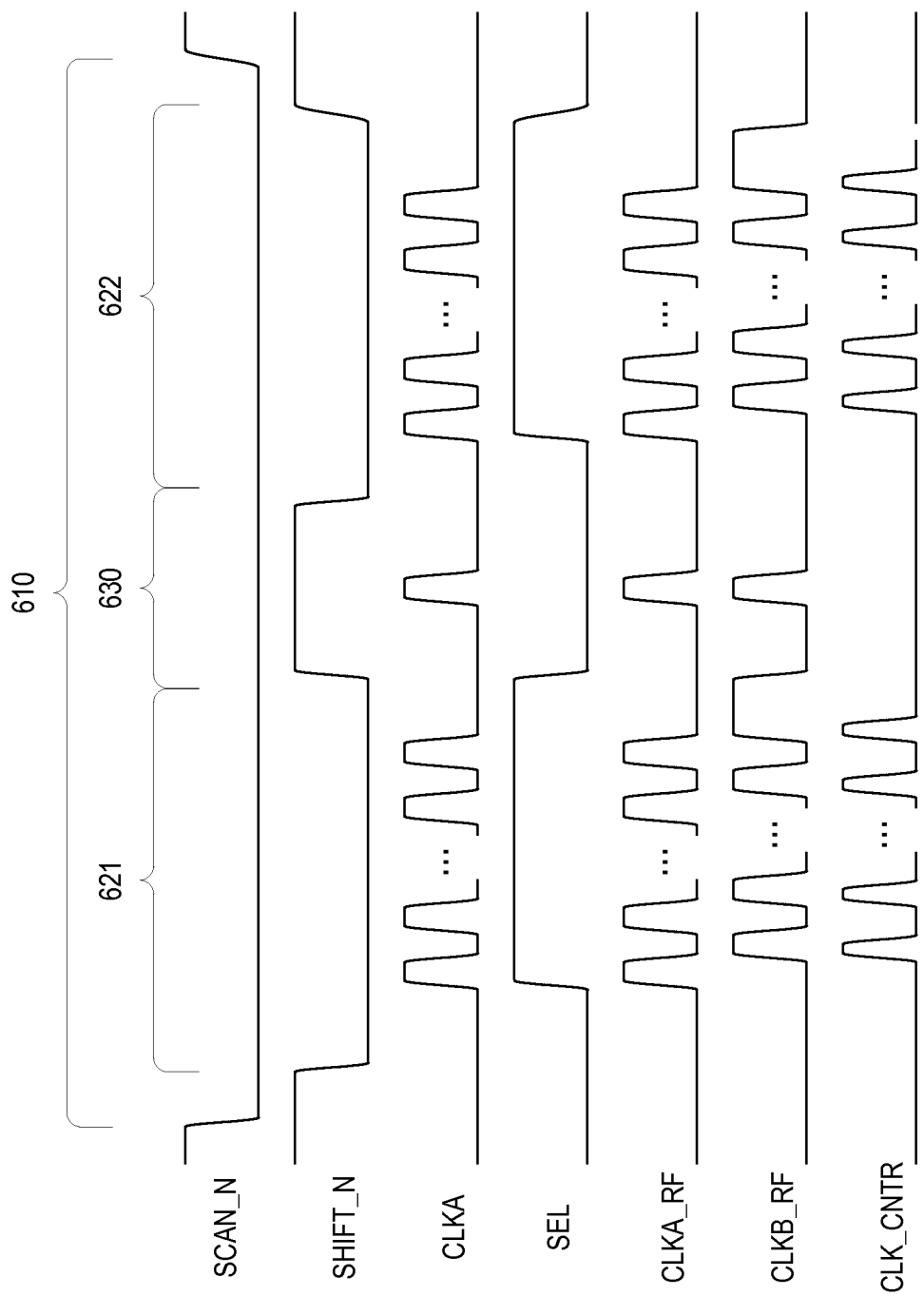
FIG. 6 is a waveform diagram illustrating operation of the scannable register file of FIG. 3, the scan logic module of FIG. 4, and the scan control module of FIG. 5.

FIG. 6 is a waveform diagram that illustrates one scan testing cycle of the scannable register file. Testing of the scannable register file may include thousands of scan testing cycles using different data values. The waveform diagram show a test phase 610 of a scan test. Functional operation of the scannable register file (and other modules of the associated SoC) occurs before and after the test phase 610. The scannable register file is in the test phase 610 when the scan enable input SCAN_N is low.

During the beginning of the test phase 610, a shift-in phase 621 occurs. The scannable register file is in the shift-in phase 621 when the scan enable input SCAN_N is low and the shift enable input SHIFT_N is low. During the shift-in phase 621, the scannable register file shifts data in on each pulse of the scan clock input CLKA. The scannable register file performs a read on each rising edge of the scan clock input CLKA and performs a write on each falling edge of the scan clock input CLKA.

A capture phase 630 follows the shift-in phase 621. The scannable register file is in the capture phase 630 when the scan enable input SCAN_N is low and the shift enable input SHIFT_N is high. During the capture phase 630, the scannable register file operates in its functional mode with reads and reads occurring based on the signals on the external read and write ports.

A shift-out phase 622 follows the capture phase 630. The scannable register file is in the shift-out phase 622 when the scan enable input SCAN_N is low and the shift enable input SHIFT_N is low. During the shift-out phase 622, the scannable register file shifts data out on each pulse of the scan clock input CLKA. The scannable register file performs a read on each rising edge of the scan clock input CLKA and performs a write on each falling edge of the scan clock input CLKA.

The shift-out phase of a scan testing cycle may be simultaneous with the shift-in phase of a next scan testing cycle. The shift-out phase and the shift-in phase perform the same operations and may be collectively referred to as shift phases. The number of clock cycles in the shift-in phase 621 and the shift-out phase 622 corresponds to the length of the associated scan chain. Transitions between the various phases may be separated by a few clock periods.

The scannable register file of FIG. 3 has one read port and one write port. The disclosed techniques for scan testing are applicable to register files with other numbers of read ports and write ports including those with combined read and write ports.

Figure 4:
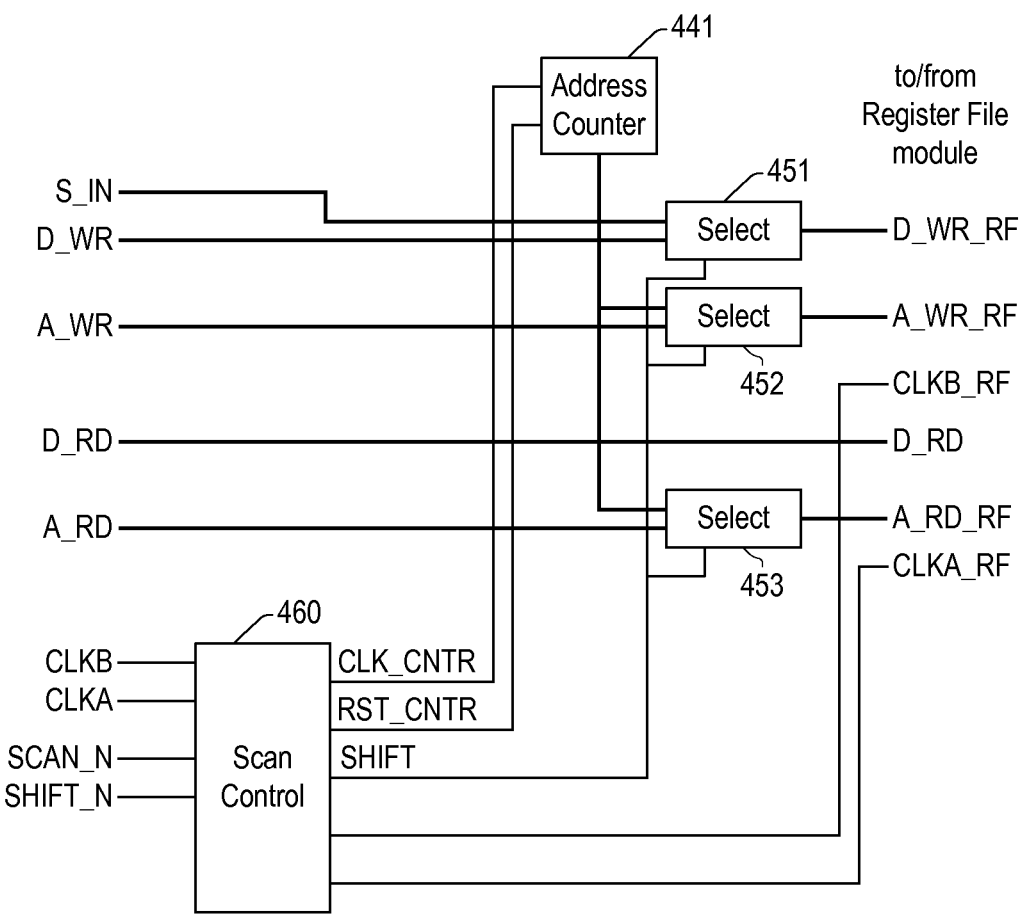
FIG. 4 is a functional block diagram of a scan logic module according to a presently disclosed embodiment.

FIG. 4 is a functional block diagram of a scan logic module according to a presently disclosed embodiment. The scan logic module 330 of FIG. 3 may be implemented using the scan logic module of FIG. 4.

The scan logic module includes an address counter 441, a scan control module 460, a write data selector 451, a write address selector 452, and a read address selector 453. The scan control module 460 receives the read clock input CLKA, the write clock input CLKB, and the scan-control input. The scannable register file uses the read clock input CLKA as a scan clock for shifting during scan test. The scan-control input, in the embodiment of FIG. 4, includes an active-low scan enable input SCAN_N and an active-low shift enable input SHIFT_N. The scan enable input SCAN_N signals scan testing (versus functional operation). The shift enable input SHIFT_N signals shift phases of scan testing. The scan control module 460 produces a register file read clock input CLKA_RF, a register file write clock input CLKB_RF, and controls for the address counter 441, the write data selector 451, the write address selector 452, and the read address selector 453. The scan control module 460 can supply the register file read clock input CLKA_RF and the register file write clock input CLKB_RF with opposite polarities to the register file module during a shift phase of a scan test.

The address counter 441 produces a count output with address values for use during shift phases of scan testing. The address values sequence through all locations of the register file module. The address counter 441 is reset by a counter reset input RST_CNTR from the scan control module 460. The address counter 441 may reset to a zero value. The reset occurs before shift phases of scan testing. During shift phases of scan testing, the address counter 441 increments the count output on each shift cycle. The address counter 441 triggers increments (counts) based on a counter clock input CLK_CNTR from the scan control module 460. The address counter 441 increments its count output modulo the number of locations in the register file. The address counter 441 may use other reset values and count sequences, for example, by incrementing by values other than one.

The write data selector 451 produces the register file write data input D_WR_RF (also referred to as the internal write data input) by selecting the scan input S_IN during shift phases of scan testing and selecting the write data input D_WR (also referred to as the external write data input) when not in a shift phase of scan testing. In an embodiment of a multi-bit wide scannable register file, the write data selector 451 may, during shift phases of scan testing, select the scan input to produce a first bit of the register file write data input and bits of the read data output D_RD to produce other bits of the register file write data input so that data are shifted from column to column during scan testing. Alternatively, a multi-bit wide scannable register file may have a scan input and a scan output for each column (bit). The write data selector 451 receives a shift enable SHIFT from the scan control module 460 to signal shift phases.

The write address selector 452 produces the register file write address input A_WR_RF (also referred to as the internal write address input) by selecting the count output of the address counter 441 during shift phases of scan testing and selecting the write address input A_WR (also referred to as the external write address input) when not in a shift phase of scan testing. The write address selector 452 receives the shift enable SHIFT from the scan control module 460 to signal shift phases.

The read address selector 453 produces the register file read address input A_RD_RF (also referred to as the internal read address input) by selecting the count output of the address counter 441 during shift phases of scan testing and selecting the read address input A_RD (also referred to as the external read address input) when not in a shift phase of scan testing. The read address selector 453 receives the shift enable SHIFT from the scan control module 460 to signal shift phases.

A selector on the read data output D_RD is not used in the embodiment of FIG. 4. The scan logic module may use a buffer to drive the scan output from the read data output D_RD.

Figure 5:
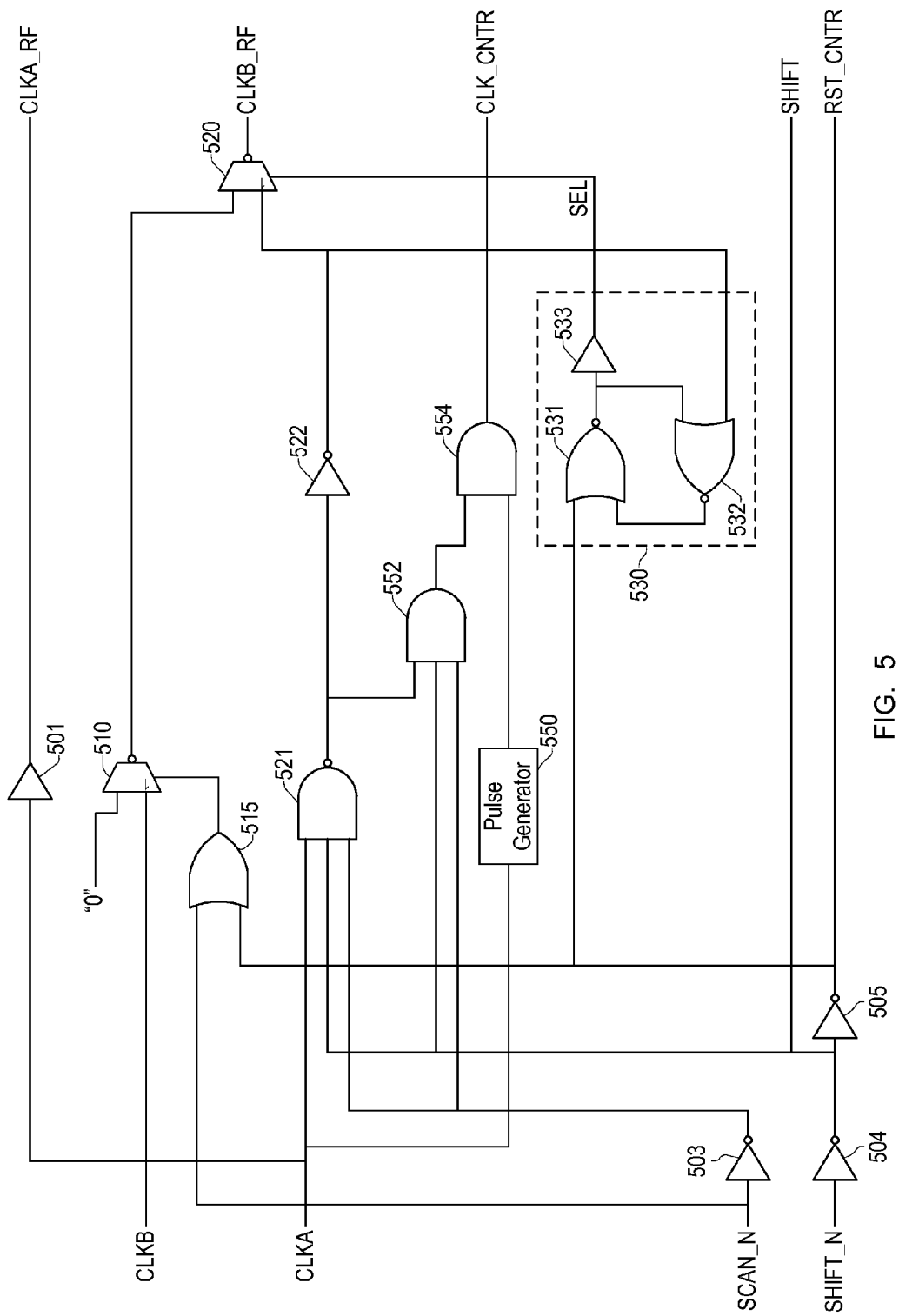
FIG. 5 is a schematic diagram of a scan control module according to a presently disclosed embodiment.

FIG. 5 is a schematic diagram of a scan control module according to a presently disclosed embodiment. The scan control module 460 of FIG. 4 may be implemented using the scan control module of FIG. 5.

The scan control module includes inverter 504 that inverts the active-low shift enable input SHIFT_N to produce the shift enable SHIFT used by the write data selector 451, the write address selector 452, and the read address selector 453 to indicate shift phases of scan testing. The scan control module includes inverter 505 that inverts the shift enable SHIFT to produce the counter reset input RST_CNTR used by the address counter 441.

The scan control module includes a pulse generator 550 that produces a pulse on falling edges of the read clock input CLKA for use in producing the counter clock input CLK_CNTR for the address counter 441. AND gate 554 produces the counter clock input CLK_CNTR by logically combining the pulse from the pulse generator 550 with the output of AND gate 552. The AND gate 552 logically combines the shift enable input SHIFT_N and the scan enable input SCAN_N (via inverter 503) so that the output indicates when the scannable register file is in the shift phase.

The scan control module produces the register file read clock input CLKA_RF (also referred to as the internal read clock input) by buffering the read clock input CLKA (also referred to as the external read clock input) with buffer 501. The read clock input CLKA is used during scan testing and may also be referred to as the scan clock input.

The scan control module produces the register file write clock input CLKB_RF (also referred to as the internal write clock input) by selecting either a buffered version of the write clock input CLKB (also referred to as the external write clock input) for functional operation (including capture phases of scan testing) or an inverted version of the read clock input CLKA for shifting operation. Production of the register file write clock input CLKB_RF with two different timings could result in transients (glitches) on transitions to and from shift phases. Such transients could cause inadvertent writes. The scan control module controls the timing of selection changes for the register file write clock input CLKB_RF to avoid transients on the register file write clock input CLKB_RF.

The scan control module includes a set-reset latch 530 that produces a control signal SEL for selector 520 that produces the register file write clock input CLKB_RF. The set-reset latch 530 includes cross-coupled NOR gates 531, 532 and buffer 533 driving the output (control signal SEL). The set-reset latch 530 is reset when not in the shift phase (by the counter reset input RST_CNTR which is a buffered version of the shift enable input SHIFT_N which is high when the scannable register file is not in the shift phase).

This operation is illustrated in FIG. 6 which shows when the control signal SEL switches and the resulting register file write clock input CLKB_RF. Waveforms of the register file read clock input CLKA_RF and counter clock input CLK_CNTR are also shown.

While the set-reset latch 530 is reset, the control signal SEL is low and selector 520 selects the output of selector 510. Selector 510 and selector 520 are inverting selectors and their outputs are the logical inverses of the selected inputs. Selector 510 selects its output based on when the scannable register file is in the shift phase as indicated by the output of OR gate 515. When in the shift phase, selector 510 selects a constant ZERO value. When in not in the shift phase, selector 510 select the write clock input CLKB. When not in the shift phase, the register file write clock input CLKB_RF is produced from the write clock input CLKB via selector 510 and selector 520.

When the scannable register file enters the shift phase, selector 510 switches from selecting the write clock input CLKB to selecting the ZERO. Since this transition occurs while the write clock input CLKB is low, no change in the output of selector 510 occurs. Additionally, the set-reset latch 530 remains reset, the control signal SEL remains low, and selector 520 continues to select the output of selector 510 so that the write clock input CLKB remains low.

On the first rising edge of the read clock input CLKA in the shift phase, the set-reset latch 530 is set by output of inverter 522 which, via NAND gate 521, matches the read clock input CLKA during the shift phase. When the set-reset latch 530 is set, the control signal SEL transitions high. The high level on the control signal SEL switches selector 520 from selecting the output of selector 510 to selecting the output of inverter 522. Since this transition occurs while both inputs to selector 520 are high, no change in the register file write clock input CLKB_RF (the output of selector 520) occurs. When the read clock input CLKA falls, the register file write clock input CLKB_RF rises via NAND gate 521, inverter 522, and selector 520. Thereafter, during the shift phase, the scan control module produces the register file write clock input CLK_B_RF as the inverse of the read clock input CLKA. Thus, the scan control module has transitioned into the shift phase without producing transients on the register file write clock input CLKB_RF.

At the end of the shift phase, the shift enable input SHIFT_N transitions high and resets the set-reset latch 530. This switches the control signal SEL low and switches selector 520 from selecting the output of inverter 522 to selecting the output of selector 510. Since this transition occurs while both inputs to selector 520 are high, no change in the register file write clock input CLKB_RF (the output of selector 520) occurs. Thereafter, the scan control module produces the register file write clock input CLKB_RF based on the write clock input CLKB via selector 510 and selector 520. Thus, the scan control module has transitioned out of the shift phase without producing transients on the register file write clock input CLKB_RF.

The schematic of FIG. 5 is an example implementation. Many variations are possible including those with different signal polarities and different combinations of logic gates and buffers.

Figure 7:
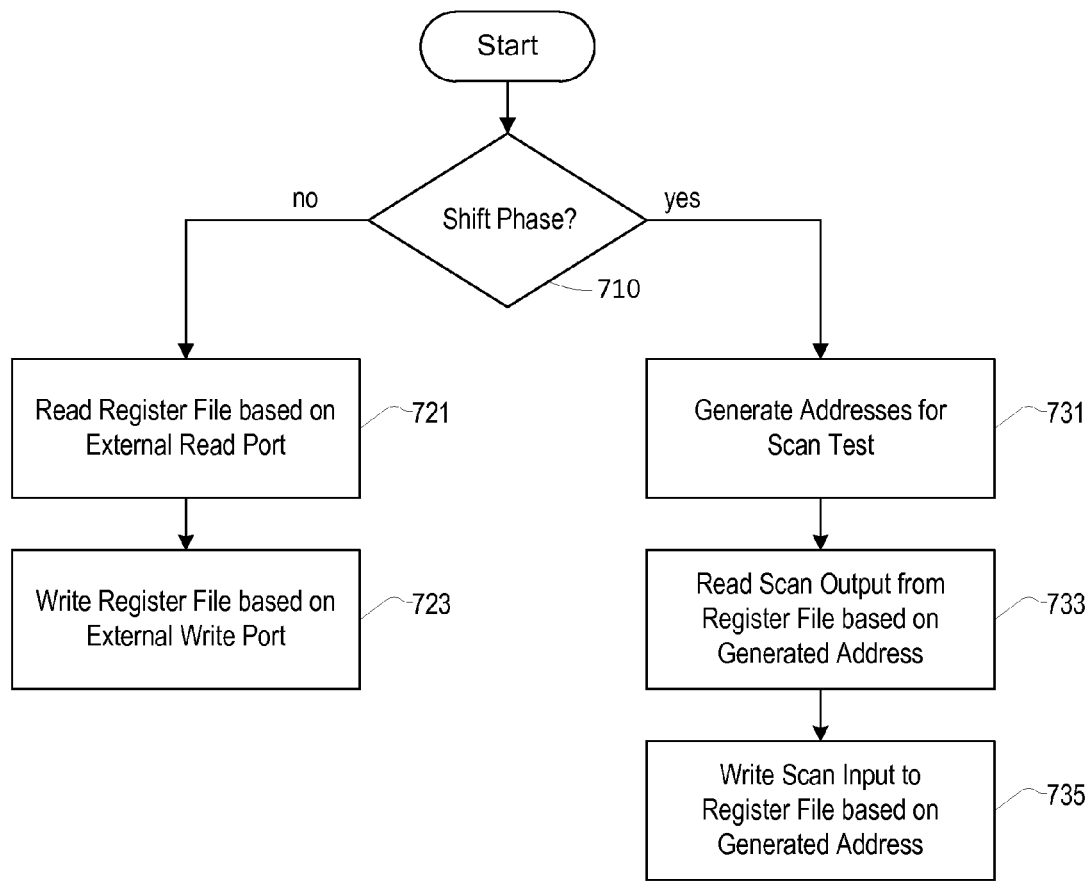
FIG. 7 is a flowchart of a process for operation of a scannable register file according to a presently disclosed embodiment.

FIG. 7 is a flowchart of a process for operation of a scannable register file according to a presently disclosed embodiment. Steps of the process may be, for example, performed using the scannable register file of FIG. 3, the scan logic module of FIG. 4, and the scan control module of FIG. 5 and will be described with reference to those modules.

In block 710, the process determines whether the scannable register file is in a shift phase of a scan test. For example, the scannable register file can determine that it is in a shift phase when the scan enable input SCAN_N is low and the shift enable input SHIFT_N is low. If the scannable register file is in the shift phase, the process continues to block 731; otherwise, the process continues to block 721.

In block 721, the scannable register file performs a read operation based on the external read port. In block 723, the scannable register file performs a write operation based on the external write port. The read operation of block 721 and the write operation of block 723 may be performed concurrently. Additionally, the read and write operations may be conditioned on enable and chip select inputs to the scannable register file.

In block 731, the scannable register file generates addresses for use in scan test. For example, the address counter 441 of the scan logic module of FIG. 4 can supply generated addresses referencing each the register file module. In block 733, the scannable register file reads from location identified by the generated address to produce the scan output. In block 735, the scannable register file writes from the scan input to the location identified by the generated address. The scannable register file may perform the reads on rising edges on a scan clock input and the writes on falling edges of the scan clock input. Block 731, block 733, and block 735 may be performed concurrently.

The process FIG. 7 may be modified, for example, by adding, omitting, reordering, or altering steps.

Although embodiments of the invention are described above for particular embodiments, many variations of the invention are possible, including, for example, those with different signal polarities. Furthermore, functions described as being performed by one module (or block) may be moved to another module or distributed across modules. Additionally, features of the various embodiments may be combined in combinations that differ from those described above.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block or distributed across to modules or blocks without departing from the invention.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A scannable register file, comprising:
   a register file configured to
      produce a read data output by reading data from a memory location selected based on a register file read address input, wherein the reading is triggered by rising edges of a register file read clock input, and
      write data from a register file write data input to a memory location selected based on a register file write address input, wherein the writing is triggered by rising edges of a register file write clock input; and
   scan logic having a scan clock input, a scan enable input, and a shift enable input as inputs and having the register file read address input, the register file write address input, the register file read clock, and the register file write clock as outputs, the scan logic being configured to supply, based on the scan clock input, the scan enable input, and the shift enable input, the register file read address input, the register file write address input, the register file read clock, and the register file write clock so that, during a shift phase of a scan test, data bits from a scan input are shifted through the memory locations to a scan output by, on each cycle of the scan clock input, reading data from one memory location to supply the scan output and writing to the one memory location with the data bit on the scan input.

2. The scannable register file of claim 1, wherein the scan logic comprises an address counter configured to produce a count output that is reset when not in the shift phase of a scan test and that counts on edges of the scan clock input.

3. The scannable register file of claim 2, wherein the scan logic further comprises a read address selector configured to supply the count output to the register file read address input during the shift phase and to supply a read address input of the scannable register file to the register file read address input when not in the shift phase.

4. The scannable register file of claim 3, wherein the scan logic further comprises a write address selector configured to supply the count output to the register file write address input during the shift phase and to supply a write address input of the scannable register file to the register file write address input when not in the shift phase.

5. The scannable register file of claim 4, wherein the scan logic further comprises a write data selector configured to supply a scan input of the scannable register file to the register file write data input during the shift phase and to supply a write data input of the scannable register file to the register file write data input when not in the shift phase.

6. The scannable register file of claim 2, wherein the scan logic is further configured to generate a counter clock input for triggering counts of the address counter.

7. The scannable register file of claim 1, wherein the scan logic is further configured to supply the register file read clock and the register file write clock with opposite polarities during the shift phase of a scan test.

8. The scannable register file of claim 7, wherein the scan logic comprises a set-reset latch configured to control supplying the register file write clock.

9. The scannable register file of claim 8, wherein the register file write clock is supplied, when the set-reset latch is reset, based on a write clock input of the scannable register file or is supplied, when the set-reset latch is set, based on an inverse of the scan clock input.

10. The scannable register file of claim 9, wherein the set-reset latch is further configured to be reset when not in the shift phase and set when the scan clock input rises during the shift phase.

11. A scannable register file, comprising a plurality of memory cells, the scannable register file configured to, during a shift phase of a scan test, shift data bits from a scan input through the plurality of memory cells to a scan output, wherein on each cycle of a scan clock: the scannable register file reads, on one of rising or falling edges of the scan clock, one of the plurality of memory cells to supply the scan output; and writes, on the other one of rising or falling edges of the scan clock, the one of the plurality of memory cells with one of the data bits on the scan input.

12. A method for use in scan testing of a register file comprising a plurality of memory cells, the method comprising:
shifting, during a shift phase of a scan test, data bits from a scan input through the plurality of memory cells to a scan output, the shifting comprising, on each cycle of a scan clock input,
reading from one of the plurality of memory cells to produce the scan output, and
writing the scan input to the one of the plurality of memory cells;
reading, when not in the shift phase, a location of the plurality of memory cells identified by an external read address input to produce a read data output; and
writing, when not in the shift phase, from an external write data input to a location of the plurality of memory cells identified by an external write address input.

13. The method of claim 12, wherein shifting further comprises:
generating addresses that identify locations in the plurality of memory cells,
wherein the ones of the plurality of memory cells read from to produce the scan output are identified by the generated addresses, and
wherein the ones of the plurality of memory cells written with the scan input are identified by the generated addresses.

14. The method of claim 13, wherein generating addresses comprises incrementing an address counter on edges of the scan clock input.

15. The method of claim 14, wherein the address counter is reset when not in the shift phase.

16. The method of claim 12, wherein reading from one of the plurality of memory cells to produce the scan output occurs on rising edges of the scan clock input.

17. The method of claim 16, wherein writing the scan input to the one of the plurality of memory cells occurs on falling edges of the scan clock input.

18. The method of claim 17, wherein writing the scan input to the one of the plurality of memory cells comprises selecting an inverse of the scan clock input to produce a register file write clock input for use in writing the scan input to the one of the plurality of memory cells.

19. The method of claim 18, wherein writing, when not in the shift phase, from the external write data input to the location of the plurality of memory cells identified by the external write address input comprises selecting an external write clock input to produce the register file write clock input for use in writing from the external write data input to the location of the plurality of memory cells identified by the external write address input.

20. An apparatus, comprising:
a means for storing data in a plurality of memory cells, and
a means for controlling the means for storing data in the plurality of memory cells to perform a scan test so that, during a shift phase of the scan test, data bits from a scan input are shifted through the plurality of memory cells to a scan output by, on each cycle of a scan clock, reading data from one of the plurality of memory cells to supply the scan output and writing to the one of the plurality of memory cells with the data bit on the scan input.

21. The apparatus of claim 20, wherein the means for controlling causes, during the shift phase of the scan test, the means for storing data to read one of the plurality of memory cells on rising edges of the scan clock and write the one of the plurality of memory cells on falling edges of the scan clock.

22. The apparatus of claim 20, wherein the means for controlling comprises a means for supplying generated addresses to the means for storing data during the shift phase of the scan test.

23. The apparatus of claim 22, wherein the means for controlling further comprises:

a means for selecting read addresses for the means for storing data that selects the generated addresses during the shift phase and selects a read address input of the apparatus when not in the shift phase; and a means for selecting write addresses for the means for storing data that selects the generated addresses during the shift phase and selects a write address input of the apparatus when not in the shift phase.

24. The apparatus of claim 23, wherein the means for controlling further comprises a means for selecting write data for the means for storing data that selects a scan input of the apparatus during the shift phase and selects a write data input of the apparatus when not in the shift phase.

25. The apparatus of claim 20, wherein the means for storing data reads data from the plurality of memory cells triggered by rising edges of an internal read clock and writes data from to the plurality of memory cells triggered by edges of an internal write clock, and wherein the means for controlling is further configured to supply the internal read clock and the internal write clock with opposite polarities during the shift phase.

26. The apparatus of claim 25, wherein the means for controlling comprises a set-reset latch configured control a selection of the internal write clock.

27. The apparatus of claim 26, wherein the selection of the internal write clock is based on a write clock input of the apparatus or is based on an inverse of the scan clock.

28. The apparatus of claim 27, wherein the set-reset latch is further configured to be reset when not in the shift phase and set when the scan clock rises during the shift phase.

* * * * *